(12) United States Patent
Whitefield et al.

(10) Patent No.: US 6,645,857 B1
(45) Date of Patent: Nov. 11, 2003

(54) KEY HOLE FILLING

(75) Inventors: Bruce J. Whitefield, Camas, WA (US); Ashwin Ramachandran, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/201,010

(22) Filed: Jul. 22, 2002

(51) Int. Cl.[7] ............................................. H01L 21/44
(52) U.S. Cl. ..................... 438/675; 438/623; 438/690; 257/773; 257/774
(58) Field of Search ................... 438/675, 623, 438/692, 690, 691; 257/773, 774, 775

(56) References Cited

U.S. PATENT DOCUMENTS 5,559,055 A * 9/1996 Chang et al. ............... 438/623
5,960,311 A * 9/1999 Singh et al. ................ 438/623
6,017,821 A * 1/2000 Yang et al. ................. 438/692

OTHER PUBLICATIONS

Lee et al., *An Early Detection Method of Device Burn–In Failure Caused by Tungsten Side–Diffusion Through Seam in Premetal Dielectric Film,* IEEE Electron Device Letters, vol 23, No. 5, May 2002, pp. 252–254.

* cited by examiner

*Primary Examiner*—Caridad Everhart
(74) *Attorney, Agent, or Firm*—Luedeka, Neely & Graham

(57) ABSTRACT

A method of forming an electrically conductive via that abuts a key hole formed in filler material. A void is etched through the filler material in which the key hole is formed, thereby forming a link between the void and the key hole. A liner is formed within the void, where the liner is formed to a thickness that is at least about half a minimum cross sectional dimension of the key hole, so as to plug the link between the void and the key hole and thereby trap any contaminants within the key hole. Electrically conductive via material is deposited within the void to form the via.

20 Claims, 2 Drawing Sheets

KEY HOLE FILLING

FIELD

This invention relates to the field of integrated circuit fabrication. More particularly, this invention relates to forming non electrically shorting voids such as vias and contacts in a fill material between two structures.

BACKGROUND

Monolithic integrated circuits are typically formed in a series of steps where a first layer is formed and patterned, and then an overlying layer is formed and patterned. With variations on this basic process, many such layers are typically formed and patterned until the integrated circuit is completed. As device geometries have shrunk, however, or in other words as the various structures within an integrated circuit are made increasingly smaller and placed increasingly closer one to another, new problems have arisen in regard to the basic process of integrated circuit fabrication.

For example, if the space between structures decreases, and the structures tend to remain at a relatively constant height, then the aspect ratio of the space between the structures tends to increase, or in other words, the measure of the height of the space between the structures as divided by the measure of the width of the space between the structures tends to increase.

While an increasing aspect ratio of a space between adjacent structures on an integrated circuit does not appear to be a dramatic problem in and of itself, it actually introduces several issues which should be analyzed and overcome in order to create a reliable integrated circuit that functions in the intended manner. For example, when a space has a relatively high aspect ratio, it tends to be more difficult to fill in with the layer that is subsequently formed. Specifically, the material of the subsequently formed layer tends to build up around the top edges of the adjacent structures that define the space, and inhibits additional material from entering the space. This tends to result in a void left in the space, which is not filled with the newly deposited material. Such voids are commonly called key holes.

When a key hole is formed, it tends to run the length of the space between the two adjacent structures. If structures such as vias or contacts are subsequently formed in the material deposited between the structures, the key holes may present a problem. For example, if two via holes are etched through the material, the key hole may provide an open conduit between the two via holes. When the conductive via material for the vias is subsequently deposited in the via holes, some of the conductive material may be deposited into the key hole from each of the two via holes, which can lead to an electrical short being formed through the key hole between the two vias.

Another problem with such key holes is that they can introduce a source of contamination to the structures of the integrated circuit. For example, in the case of the formation of vias, as described briefly above, the key hole between two via holes may trap some of the materials and chemicals used to form the via holes. Because the key hole tends to be rather small and is not directly accessible, it tends to be relatively difficult to clean out during normal processing. Therefore, the contaminants that collect in the key hole during standard processing may not be removed, as they preferably should be.

At a later point in the processing of the integrated circuit, such as when electrically conductive vias or other structures are formed, the contaminants in the key hole may inhibit proper formation of the vias. In addition, such contaminants may work over time to inhibit proper operation of the via, resulting in a failure at a later point in time and reducing the reliability of the integrated circuits so fabricated. Such problems can exist even when the key hole does not bridge a gap between adjacent vias.

One method to overcome the problem with key holes is to use new fill materials that deposit in a more uniform fashion, and which are less susceptible to the formation of key holes. However, as device geometries continue to shrink, the materials that first worked with a given aspect ratio may not continue to work as the aspect ratio continues to increase, and thus even more new materials must be identified and new processes created. Further compounding this issue is that as device geometries shrink, the fill material that is used between adjacent structures, such as an electrically insulating fill material, must have certain properties, such as high structural integrity or a low dielectric constant. Some of the these desired properties may not be compatible with the likewise desired property of not forming key holes.

What is needed, therefore, is a method by which materials that tend to form key holes can be reliably used as the fill material between adjacent structures, while overcoming the problems of contamination and electrical shorting.

SUMMARY

The above and other needs are met by a method of forming an electrically conductive via that abuts a key hole formed in filler material. A void is etched through the filler material in which the key hole is formed, thereby forming a link between the void and the key hole. A liner is formed within the void, where the liner is formed to a thickness that is at least about half a minimum cross sectional dimension of the key hole, so as to plug the link between the void and the key hole and thereby trap any contaminants within the key hole. Electrically conductive via material is deposited within the void to form the via.

In this manner, the liner material prohibits and preferably prevents contaminants that are trapped within the key hole from contacting the electrically conductive via material, and damaging it. Thus, a more reliable via is formed according to a method of the present invention.

According to another aspect of the invention, there is described a method of forming a first electrically conductive via adjacent a second electrically conductive via, where the first electrically conductive via and the second electrically conductive via each abut a common key hole formed in a non electrically conductive filler material. A first void and a second void are etched through the non electrically conductive filler material in which the key hole is formed, thereby forming a first link between the first void and the key hole and a second link between the second void and the key hole. An electrically conductive liner is formed within the first void and the second void, where the liner is formed to a thickness that is at least about half a minimum cross sectional dimension of the key hole, so as to plug the first link between the first void and the key hole and the second link between the second void and the key hole, and thereby trap any contaminants within the key hole. The liner is formed in a manner such that liner material entering the key hole from the first void does not contact liner material entering the key hole from the second void. Electrically conductive via material is deposited within the first void and the second void to respectively form the first via and the second via.

This embodiment has the benefits of the first embodiment, but has an additional benefit of not having an electric short between the two vias, because the liner is formed in a manner such that liner material entering the key hole from the first void does not contact liner material entering the key hole from the second void. Thus, the liner material may be electrically conductive.

According to yet another aspect of the invention, there is described a method of forming a first electrically conductive via adjacent a second electrically conductive via, where the first electrically conductive via and the second electrically conductive via each abut a common key hole formed in a filler material. A first void and a second void are etched through the filler material in which the key hole is formed, thereby forming a first link between the first void and the key hole and a second link between the second void and the key hole. A non electrically conductive liner is formed within the first void and the second void. The liner is formed to a thickness that is at least about half a minimum cross sectional dimension of the key hole, so as to plug the first link between the first void and the key hole and the second link between the second void and the key hole, and thereby trap any contaminants within the key hole. The liner is removed from a bottom of the first void and a bottom of the second void, and electrically conductive via material is formed within the first void and the second void to respectively form the first via and the second via.

In this embodiment, a non electrically conductive liner material is used, and the liner material entering the key hole from the first void can contact the liner material entering the key hole from the second void, because it is not electrically conductive. However, in this embodiment the liner material is preferably removed from the bottoms of the voids, so that the vias can make electrical contact with the underlying layer.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
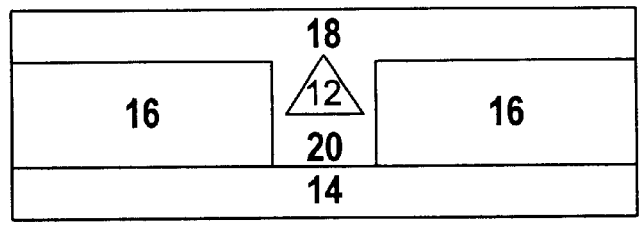
FIG. 1 is a cross sectional view of a key hole along a first axis.
Figure 2:
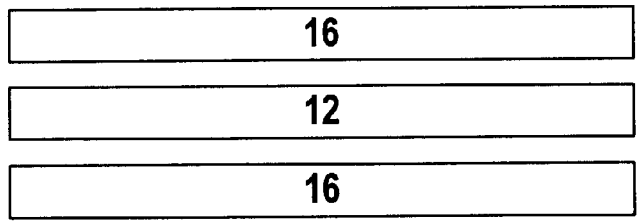
FIG. 2 is a top plan view of the key hole.
Figure 3:
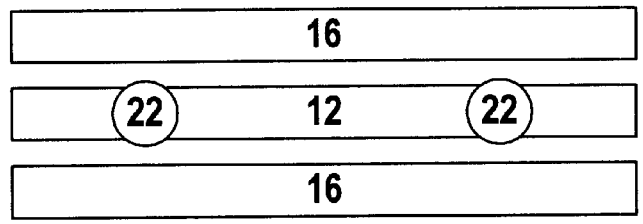
FIG. 3 is a top view of the key hole with adjacent voids formed.
Figure 4:
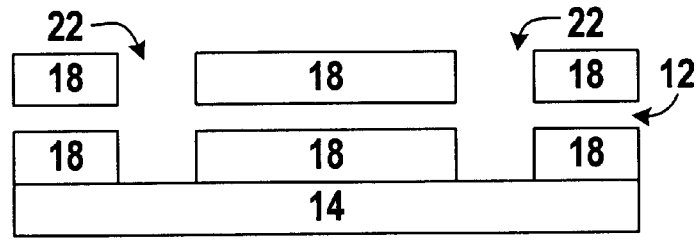
FIG. 4 is a cross sectional view of the key hole and adjacent voids along a second axis that is perpendicular to the first axis.

With reference now to FIG. 1 there is depicted a cross sectional view of a key hole 12 along a first axis of an integrated circuit 10. As mentioned above, the key hole 12 tends to form between two structures 16 that define a relatively high aspect ratio gap 20 when it is filled with a filler material 18. As depicted in FIG. 1, the key hole 12 has a generally triangular cross section. It is appreciated that this cross sectional shape is by way of example only, and in actual embodiment the key hole 12 may have a variety of different cross sections. FIG. 2 depicts a top plan view of the key hole 12 between the two structures 16, where is it is seen that the key hole 12 tends to run the entire length of the gap 20 between the two structures 16. FIG. 3 depicts a top plan view of the voids 22 that are etched in the filler material 18 in the gap 20 between the two structures. As indicated in FIG. 3, and better seen in the cross sectional view of FIG. 4 which is taken along the length of the key hole 12, the key hole 12 tends to create a conduit between the two voids 22.

Figure 5:
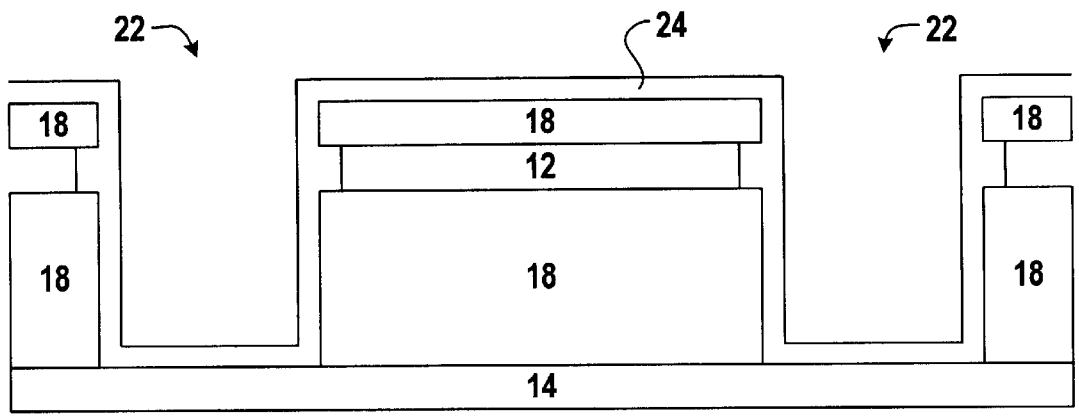
FIG. 5 is a cross sectional view of the key hole and adjacent voids after formation of the liner.

According to the present invention, a liner 24 is formed within the voids 22, as depicted in FIG. 5. The liner 24 is preferably formed with a highly conformal method, so that it isn't just formed in the bottoms of the voids 22. Rather, it is desired that the liner 24 be formed on the side walls of the voids 22, and to a thickness that is preferably at least as thick as about half the minimum cross sectional dimension of the key hole 12. When deposited in this manner, the liner 24 tends to plug the ends of the key hole 12. Thus, any contaminants that are present in the key hole 12 are trapped and preferably isolated from the material that will be later used to form the vias in the voids 22.

A few comments are made at this point in regard to the various materials that can be used. The structures 16 which define the gap 20 may be of either an electrically conductive or a non electrically conductive material. As described herein, the structures 16 are not so much a part of the invention as they are the means by which the key hole 12 was undesirably formed, as described above. It is appreciated that key holes 12 may be formed in other ways, and the present invention is applicable to such key holes 12 as well.

The filler material 18 may be either electrically conductive, or non electrically conductive. However, if the filler material 18 is electrically conductive, then the liner material 24 is preferably non electrically conductive. The reason for this is that the via material that is formed at a later step in the process is preferably electrically conductive, and it is desired to insulate the via material from the filler material 18. Most preferably the filler material is non electrically conductive, such as at least one of silicon oxide, low k material, spin on glass, and silicon nitride, or some other such dielectric material as is used in the integrated circuit fabrication industry.

The liner material 24 may be either electrically conductive or non electrically conductive, such as based upon the considerations mentioned above. However, in a most preferred embodiment the liner material 24 is non electrically conductive, such as at least one of silicon oxide, silicon nitride, and titanium nitride, or some other such dielectric material as is used in the integrated circuit fabrication industry.

Especially in the case where the liner material 24 is an electrically conductive material, the liner 24 is preferably deposited in a manner such that the electrically conductive material 24 does form an electrically conductive member through the key hole 12, as this would create an electrical short between the vias that are to be formed. However, in the more preferred embodiment where the liner material 24 is a non electrically conductive material, then there is less reason for preventing the liner material 24 from bridging from one void 22 to the other void 22 through the key hole 12.

For example, the liner material 24 may be silicon oxide or silicon nitride that is deposited in a chemical vapor deposition process. Alternately, the liner material 24 may be titanium nitride that is deposited with either a chemical vapor deposition process or a physical vapor deposition process. In a most preferred embodiment, the liner 24 is a silicon oxide that is deposited by chemical vapor deposition.

Figure 6:
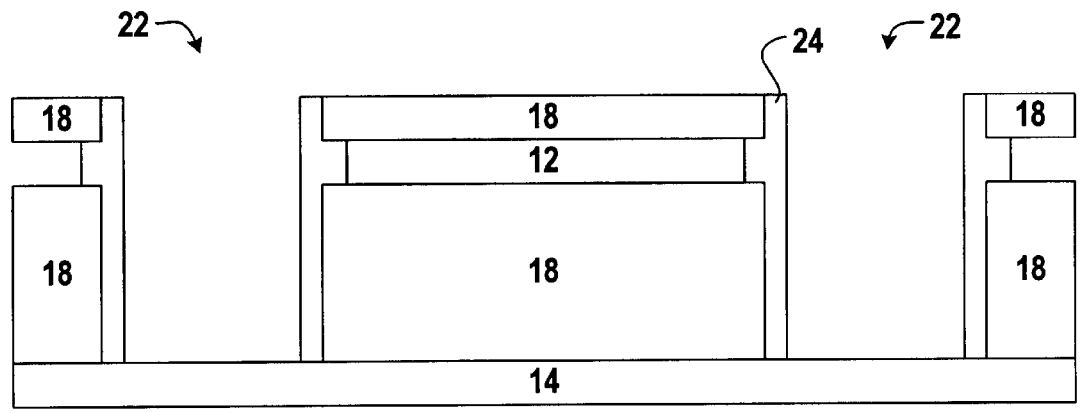
FIG. 6 is a cross sectional view of the key hole, the adjacent voids, and the liner after the bottom of the liner has been etched.

Especially in the case where the liner material 24 is non electrically conductive, the liner material 24 is most preferably selectively removed from the bottoms of the voids 22, so that the via material that is formed during a later processing step makes electrical contact to the underlying layer 14, or some other layer to which electrical contact with the via is desired. The liner 24 is preferably so removed using a highly anisotropic etch, which tends to remove liner material 24 preferentially from the bottom of the voids 22, rather than from the side walls of the voids 22. Such an etch also tends to remove the liner material 24 from the top surface of the integrated circuit 10, as depicted in FIG. 6. In alternate embodiments, the top surface of the integrated circuit 10 is masked, so that the liner material 24 is not removed from the top surface of the integrated circuit 10.

Figure 7:
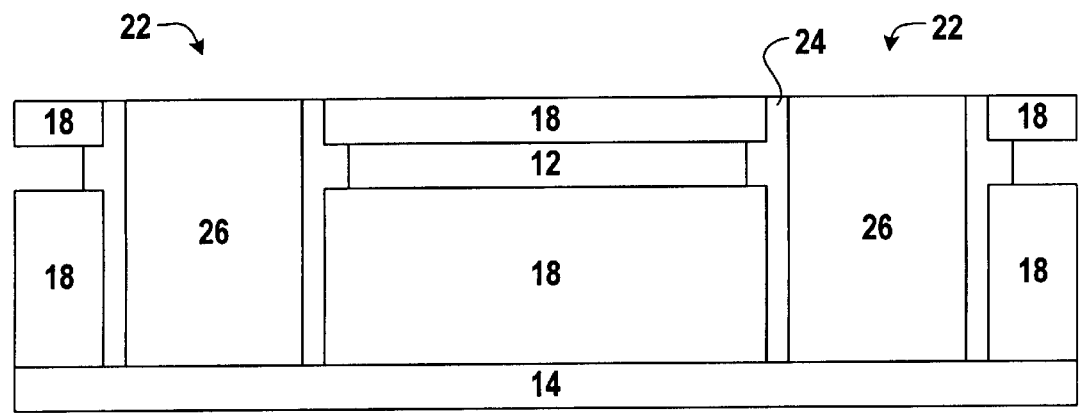
FIG. 7 is a cross sectional view of the completed vias.

As depicted in FIG. 7, the via material 26 is preferably formed in the voids 22 so as to complete the formation of the vias. In a most preferred embodiment, the via material 26 is an electrically conductive material that makes electrical contact to the underlying layer 14, and the liner material 24 is a non electrically conductive material that prohibits electrical shorting of the vias through the key hole 12, and prohibits contaminants within the plugged key hole 12 from attacking and degrading the integrity of the vias. Subsequent processing is preferably accomplished to complete the formation of the integrated circuit 10.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of forming an electrically conductive via that abuts a key hole formed in filler material, the method comprising the steps of:
   etching a void through the filler material in which the key hole is formed, thereby forming a link between the void and the key hole,
   forming a liner within the void, the liner formed to a thickness that is at least about half a minimum cross sectional dimension of the key hole, so as to plug the link between the void and the key hole and thereby trap any contaminants within the key hole, and
   depositing electrically conductive via material within the void to form the via,
   wherein at least one of the filler material and the liner is a non electrically conductive material.

2. The method of claim 1 further comprising the step of removing the liner from a bottom of the void before depositing the via material within the void.

3. The method of claim 1 wherein the filler material is non electrically conductive.

4. The method of claim 1 wherein the filler material is at least one of silicon oxide, low k material, spin on glass, and silicon nitride.

5. The method of claim 1 wherein the liner is a non electrically conductive material.

6. The method of claim 1 wherein the liner is at least one of silicon oxide, silicon nitride, and titanium nitride.

7. The method of claim 1 wherein the liner is an electrically conductive material.

8. An integrated circuit, the improvement comprising a via formed according to the method of claim 1.

9. A method of forming a first electrically conductive via adjacent a second electrically conductive via, where the first electrically conductive via and the second electrically conductive via each abut a common key hole formed in a non electrically conductive filler material, the method comprising the steps of:
   etching a first void and a second void through the non electrically conductive filler material in which the key hole is formed, thereby forming a first link between the first void and the key hole and a second link between the second void and the key hole,
   forming an electrically conductive liner within the first void and the second void, the liner formed to a thickness that is at least about half a minimum cross sectional dimension of the key hole, so as to plug the first link between the first void and the key hole and the second link between the second void and the key hole, and thereby trap any contaminants within the key hole, the liner formed in a manner such that liner material entering the key hole from the first void does not contact liner material entering the key hole from the second void, and
   depositing electrically conductive via material within the first void and the second void to respectively form the first via and the second via.

10. The method of claim 9 further comprising the step of removing the liner from a bottom of the first void and a bottom of the second void before depositing the via material within the first void and the second void.

11. The method of claim 9 wherein the filler material is at least one of silicon oxide, low k material, spin on glass, and silicon nitride.

12. An integrated circuit, the improvement comprising a first via and a second via formed according to the method of claim 9.

13. A method of forming a first electrically conductive via adjacent a second electrically conductive via, where the first electrically conductive via and the second electrically conductive via each abut a common key hole formed in a filler material, the method comprising the steps of:
   etching a first void and a second void through the filler material in which the key hole is formed, thereby forming a first link between the first void and the key hole and a second link between the second void and the key hole,
   forming a non electrically conductive liner within the first void and the second void, the liner formed to a thickness that is at least about half a minimum cross sectional dimension of the key hole, so as to plug the first link between the first void and the key hole and the second link between the second void and the key hole, and thereby trap any contaminants within the key hole,
   removing the liner from a bottom of the first void and a bottom of the second void, and
   depositing electrically conductive via material within the first void and the second void to respectively form the first via and the second via.

14. The method of claim 13 wherein the liner is formed in a manner such that liner material entering the key hole from the first void does not contact liner material entering the key hole from the second void.

15. The method of claim 13 wherein the filler material is non electrically conductive.

16. The method of claim 13 wherein the filler material is at least one of silicon oxide, low k material, spin on glass, and silicon nitride.

17. The method of claim 13 wherein the liner is at least one of silicon oxide, silicon nitride, and titanium nitride.

18. The method of claim 13 wherein the liner is formed with a chemical vapor deposition process.

19. The method of claim 13 wherein the liner is formed with a physical vapor deposition process.

20. An integrated circuit, the improvement comprising a first via and a second via formed according to the method of claim 13.

* * * * *